United States Patent [19]
Elias

[11] Patent Number: 5,201,671
[45] Date of Patent: Apr. 13, 1993

[54] FLEX PULL TAB FOR SURFACE MOUNT CONNECTOR

[75] Inventor: Simon G. Elias, Houston, Tex.

[73] Assignee: Compaq Computer Corporation, Houston, Tex.

[21] Appl. No.: 825,160

[22] Filed: Jan. 24, 1992

[51] Int. Cl.$^5$ .............................................. H01R 13/00
[52] U.S. Cl. ...................................... 439/483; 439/492
[58] Field of Search ............... 439/152, 160, 476, 483, 439/484, 77, 492, 497, 499, 67

[56] References Cited

U.S. PATENT DOCUMENTS

| | | |
|---|---|---|
| 3,546,775 | 12/1970 | Lalmond et al. |
| 3,573,704 | 4/1971 | Tarver ............................ 439/497 X |
| 4,285,561 | 8/1981 | Chow ............................. 439/497 X |
| 4,310,208 | 1/1982 | Webster et al. ................ 439/483 X |
| 4,639,058 | 1/1987 | Morgan .......................... 439/476 X |
| 4,800,461 | 1/1989 | Dixon et al. |
| 5,001,604 | 3/1991 | Lusby . |

OTHER PUBLICATIONS

Teledyne Electro-Mechanisms, *Rigid Flex.*
Dixon, *A New Generation of Flat-Wire Packaging Techniques*, The Electronic Engineer's Design Mag., Sep. 28, 1966.
Rogers Corp., *Lower Your Costs with Flexible Circuitry* (1977).
Rogers Corp., *Innovators in Controlled Impedance Interconnections* (1986).
Markstein, *Flexible Circuits Show Design Versatility*, Electronic Packaging and Production Mag., Apr. 1989 at 32-35.
Dixon, *Rigid Flex: Where We've Been and Where We are Going*, (Inst. for Interconnecting and Packaging Electronic Circuits, Apr. 1989).

Primary Examiner—Larry I. Schwartz
Assistant Examiner—Khiem Nguyen
Attorney, Agent, or Firm—Pravel, Hewitt, Kimball & Krieger

[57] ABSTRACT

A flexible pull tab and a surface mount connector attached on opposite sides of a flexible printed circuit board is disclosed. The flexible pull tab is folded back so that the tab ends touch to ensure easy gripping for removal of connector perpendicular to the connector.

12 Claims, 1 Drawing Sheet

U.S. Patent    Apr. 13, 1993    5,201,671
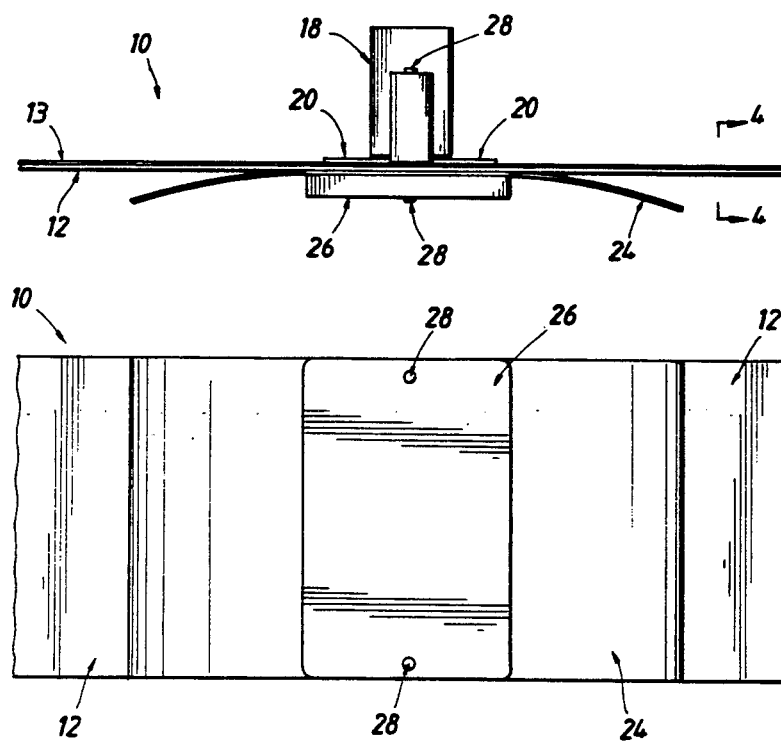
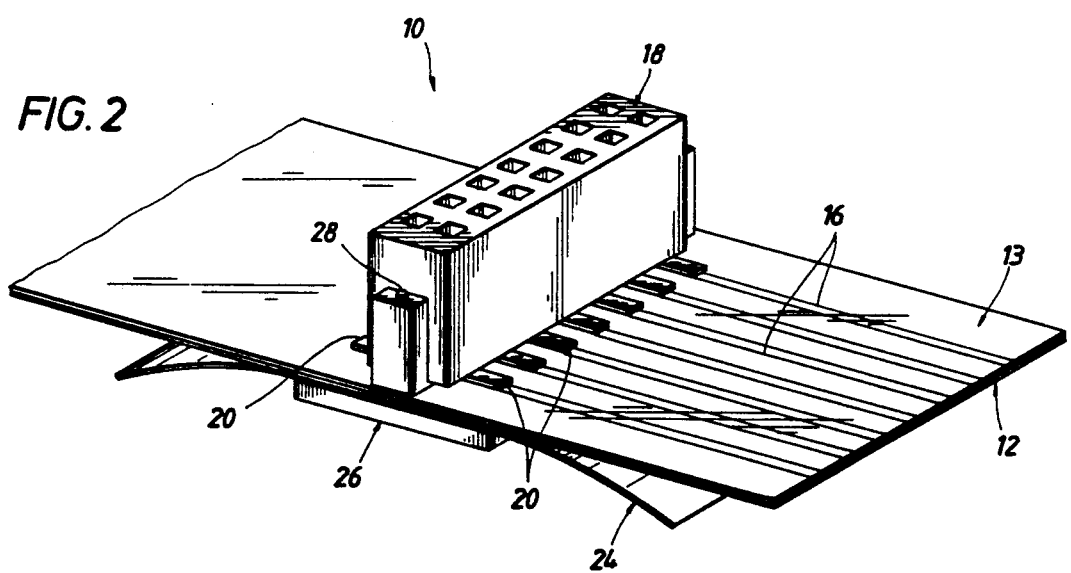

FLEX PULL TAB FOR SURFACE MOUNT CONNECTOR

BACKGROUND OF THE INVENTION

1. Field of the Invention

This invention generally relates to an apparatus for disconnecting a surface mount connector. In particular, this invention relates to an improved surface mount connector having a flexible pull disconnect tab adapted for use with a flexible printed circuit board.

2. Description of Prior Art

In the field of electronics, innovations often create new opportunity for better ways of doing things. Recent innovations have included the use of surface mount connectors adapted for use with flexible printed circuit boards. Conventional surface mount connectors are typically attached by an acrylic adhesive to one side of the flexible printed circuit board. This flexible printed circuit board typically consists of two or more flexible insulator layers with conductor layers laminated between the insulator layers. The connector pads are flow soldered through openings in the insulator layers to the conductors in the flexible printed circuit board. If greater stability in insertion and removal is desired, a backing plate has been attached to the other side of the flexible printed circuit board, opposite the connector, to facilitate disconnecting the connector.

These conventional connectors often require high insertion and removal forces. These removal forces have typically been introduced by folding back the flexible printed circuit board on one or both sides of the connector and pulling upwardly. The prior art apparatus when removed as disclosed introduces an undesirable loading on the conductors of the flexible printed circuit board and the connector. After a number of insertions and removal, failure of the conductors on the flexible printed circuit board and/or connector could occur depending on factors such as temperature, loading and fatigue (number of removals).

Another disadvantage of the prior art apparatus is that an undesirable amount of stress is placed on the solder connection between the surface mount connector and the flexible printed circuit board. Eventually, this could cause the solder connection to fail, and due to the small size and the nature of the solder connections, such failures could be intermittent and difficult to detect.

A third disadvantage of the prior art apparatus is that flexible printed circuit boards are not designed to be folded back for disconnection of the surface mount connectors. Often not enough material is supplied to provide a good "hand hold", that could undesirably encourage the user to use only one side of the flexible circuit board to attempt removal that further exacerbates the above disclosed disadvantages.

Therefore it would be desirable to minimize stress on flexible printed circuit boards when disconnecting high insertion force surface mount connectors.

SUMMARY OF INVENTION

Briefly, an improved apparatus for disconnecting a surface mount connector adapted for use with a flexible printed circuit board is provided. A surface mount connector is attached to a flexible printed circuit board. A flexible pull tab fashioned from a flexible strip is mounted on the other side opposite the surface mount connector's location. A plate is mounted on the back of the flexible pull tab opposite of the surface mount connector.

When it is desired to disconnect the surface mount connector, the two pieces of the flexible pull tab are folded back and grasped by fingers or other means and pulled perpendicular from the connection. The stresses of disconnection are borne by the flexible pull tab rather than the flexible printed circuit boar itself. Thus, stresses to the connections and to the flexible printed circuit board are reduced, and because of the unique position of the flexible pull tab, a perpendicular direction of removal can be effectuated, and enough surface area in the flexible pull tab ensures easy grasping.

BRIEF DESCRIPTION OF DRAWINGS

The objects, advantages and features of the invention will become more apparent by reference to the drawings which are appended hereto and wherein like numerals indicate like parts and wherein an illustrated embodiment of the invention is shown, of which:

FIG. 1 is an elevational view of the present invention;

FIG. 2 is a perspective view of the present invention as shown in FIG. 1;

FIG. 3 is an enlarged bottom view of the present invention; and

FIG. 4 is a cross-sectional view of the flexible printed circuit board used with the present invention.

DETAILED DESCRIPTION OF INVENTIONS

Flexible printed circuit boards and surface mount connectors are well known to those skilled in the art. U.S. Pat. Nos. 4,800,461 and 5,001,604 relating to flexible circuit boards are incorporated herein by reference for all purposes. U.S. Pat. No. 4,800,461 discloses a multilayer combined rigid flexible printed circuit board. U.S. Pat. No. 5,001,604 discloses an embedded rigid flex printed circuit board testing circuit and a method for fabricating such a circuit.

With reference to the Figs., a flexible printed circuit board, generally indicated at 10, is shown having flexible insulator layers 12 and 13. Conductor layer 16 is laminated between flexible insulator layers 12 and 13. U.S. Pat. No. 4,800,461 discloses preferred materials for use in the manufacture of flexible insulator layers and further shows that multiple conductor layers may be used between multiple insulator layers. Typically, the flexible insulator would be manufactured from polyamide film.

Also shown is a surface mount connector 18 with conductor pads 20. Through openings in insulator layer 13, these conductor pads 20 are soldered to conductor layer 16 to electrically connect the pins 22 disposed inside the surface mount connector 18 to the conductor layer 16. Either male or female pins of a surface mount connector can be used for connection with a complementary connector, such as one located on a rigid circuit board.

As best shown in FIGS. 1 and 2, a flexible pull tab 24, preferably fabricated from polyamide film, is attached to the flexible printed circuit board 10. Though other materials could be used to fabricate the flexible pull tab 24, the resulting tab should be strong enough to at least support the maximum force required to disconnect surface mount connector 18 from its complementary connector. Preferably, a backing plate 26, as shown in the Figs., is attached to the flexible pull tab to distribute the loading of the flexible pull tab 24 and/or to attach the tab to the circuit board 10. This backing plate 26 is preferably at least as wide as the distance across the surface mount connector 18 and its conductor pads 20.

The surface mount connector 18 and the flexible pull tab 24 are attached on opposite sides of the flexible printed circuit board 10 by means well known in the art, preferably by acrylic adhesive. This adhesive must withstand removal forces necessary to disconnect the surface mount connector 18 from its complementary connector.

Backing plate 26 is preferably attached to the flexible pull tab 24 with an adhesive. Alternately, or in addition to the adhesive, the apparatus can be assembled using a locking pin 28. Locking pin 28 is received into a bore in the surface mount connector 18, and an aperture extending through the flexible printed circuit board 10, the flexible pull tab 24, and is received in a bore of backing plate 26. Locking pin 28 can be a pin, screw, tack or other conventional device which effectively secures the surface mount connector 18 to backing plate 26.

The foregoing disclosure and description of the invention are illustrative and explanatory thereof, and various changes in the size, shape and materials, as well as in the details of the illustrated construction may be made without departing from the spirit of the invention.

What is claimed is:

1. An apparatus for allowing a user to disconnect a first electrical connector from a second electrical connector, the apparatus comprising:
   a flexible conductor having a first side and a second side, the first electrical connector being attached to said first side of said flexible conductor;
   first attaching means for attaching the first electrical connector to said first side of said flexible conductor;
   a flexible tab having a first side, a second side, a first end, and a second end, said first side of said tab being attached to said second side of said flexible conductor at a location opposite the first electrical connector, said first end and said second end extending freely away from said location of attachment of said tab to said flexible conductor a sufficient distance to allow said first end and said second end to be readily grasped by a user for disconnecting the first electrical connector from the second electrical connector; and
   second attaching means for attaching said tab to said second side of said flexible conductor adjacent the first electrical connector.

2. Apparatus of claim 1 wherein said first and second attaching means comprises an adhesive.

3. Apparatus of claim 1 further comprising:
   a plate attached to said second side of said flexible tab; and
   third attaching means for attaching said plate to said flexible tab overlaying the first electrical connector.

4. Apparatus of claim 3 wherein said third attaching means comprises an adhesive.

5. Apparatus of claim 3 wherein said first, second and third attaching means comprises an adhesive and a locking pin.

6. Apparatus of claim 3 wherein said first, second and third attaching means comprises a locking pin.

7. Apparatus of claim 1 wherein said flexible tab has a first end and a second end and has a sufficient surface area so that when attached to the flexible conductor the tab can be folded back for disconnecting the first electrical connector from the second electrical connector.

8. Apparatus of claim 1 wherein said flexible conductor is a flexible printed circuit board.

9. Apparatus of claim 8 wherein the first electrical connector has a first end and a second end;
   a first bore disposed in said first end of the first electrical connector;
   a second bore disposed in said second end of the first electrical connector; and
   said first bore and said second bore being substantially perpendicular to said flexible printed circuit board.

10. Apparatus of claim 9 further comprising a locking pin wherein said locking pin extends through said flexible printed circuit board and said flexible tab, and is received in one of said bores of the first electrical connector.

11. Apparatus of claim 10 further comprising a backing plate having a firs bore and a second bore to operably allow said locking pin to be received in one of said plate bores to attach said plate, said tab, said flexible printed circuit board and the first electrical connector.

12. An apparatus for disconnecting a first electrical connector from a second electrical connector, comprising:
   a flexible conductor having a first side and a second side, the first electrical connector being attached to said first side of said flexible conductor;
   first attaching means for attaching the first electrical connector to said first side of said flexible conductor;
   a flexible tab having a first side, a second side, a first end and a second end, said first side of said tab being attached to said second side of said flexible conductor at a location opposite the first electrical connector for disconnecting the first electrical connector from the second electrical connector, wherein said flexible tab has a sufficient surface area so that when attached to the flexible conductor, the tab can be folded back for disconnecting the first electrical connector from the second electrical connector and wherein sufficient tab surface area projects from each end of said flexible tab to allow the ends of said flexible tab to touch when said flexible tab is folded back; and
   second attaching means for attaching said tab to said second side of said flexible conductor adjacent the first electrical connector.

* * * * *

UNITED STATES PATENT AND TRADEMARK OFFICE
CERTIFICATE OF CORRECTION

PATENT NO.   :   5,201,671
DATED        :   APRIL 13, 1993
INVENTOR(S)  :   SIMON G. ELIAS, ET AL.

It is certified that error appears in the above-identified patent and that said Letters Patent is hereby corrected as shown below:

In Col. 4, Line 30, please replace "firs" with --first--.

Signed and Sealed this

Thirtieth Day of November, 1993

Attest:

BRUCE LEHMAN

Attesting Officer

Commissioner of Patents and Trademarks